(12) United States Patent
Xu et al.

(10) Patent No.: US 11,994,536 B2
(45) Date of Patent: May 28, 2024

(54) DIGITAL OSCILLOSCOPE HAVING FRACTIONAL CALCULUS OPERATION AND DISPLAY FUNCTION

(71) Applicant: UNIVERSITY OF ELECTRONIC SCIENCE AND TECHNOLOGY OF CHINA, Sichuan (CN)

(72) Inventors: Bo Xu, Chengdu (CN); Kai Chen, Chengdu (CN); Libing Bai, Chengdu (CN); Lulu Tian, Chengdu (CN); Hang Geng, Chengdu (CN); Yuhua Cheng, Chengdu (CN); Songting Zou, Chengdu (CN); Jia Zhao, Chengdu (CN); Yanjun Yan, Chengdu (CN); Xiaoyu Huang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 340 days.

(21) Appl. No.: 17/515,987

(22) Filed: Nov. 1, 2021

(65) Prior Publication Data
US 2022/0373577 A1    Nov. 24, 2022

(30) Foreign Application Priority Data

May 12, 2021 (CN) .......................... 202110514250.7

(51) Int. Cl.
*G01R 13/40*     (2006.01)
*G01R 13/02*     (2006.01)

(52) U.S. Cl.
CPC ........... *G01R 13/403* (2013.01); *G01R 13/02* (2013.01); *G01R 13/0209* (2013.01)

(58) Field of Classification Search
None
See application file for complete search history.

(56) References Cited

U.S. PATENT DOCUMENTS

| 10,885,604 | B2 | 1/2021 | Huang et al. | |
| 2008/0013456 | A1* | 1/2008 | Hafed | G01R 31/3193 370/241 |
| 2010/0057388 | A1* | 3/2010 | LeBrun | H04L 12/403 702/67 |

OTHER PUBLICATIONS

Mohammed F. Tolba et al., "FPGA Implementation of Fractional-Order Integrator and Differentiator Based on Grünwald Letnikov's Definition", 2017 29th international conference on Microelectronics (ICM), Date of Conference: Dec. 10-13, 2017, Date Added to IEEE Xplore: Jan. 25, 2018.

(Continued)

*Primary Examiner* — Nasima Monsur
(74) *Attorney, Agent, or Firm* — Oliff PLC (57) ABSTRACT

The present invention provides a system for data mapping and storing in digital three-dimensional oscilloscope, wherein the fixed coefficients, which are calculated according the parameters and settings of a digital oscilloscope, are stored into a fixed coefficient memory CO RAM, the fixed coefficients are outputted to N fractional operation units through N−1 D flip-flop delay units to multiply with the acquired data x(n) and then be accumulated, thus N fractional calculus results are obtained. In this way, N fractional calculus results can be obtained by performing L/N fractional calculus operations. N fractional calculus results are sent to a signal processing and display module, in which they are converted into a display data through a drawing thread, and the display data are sent to LCD for displaying, thus the fractional calculus operation and display of a input signal in a digital oscilloscope is realized.

2 Claims, 3 Drawing Sheets (56) References Cited

OTHER PUBLICATIONS

Mohammed F. Tolba et al., "Fractional order integrator/differentiator: FPGA implementation and FOPID controller application", International Journal of Electronics and Communications, vol. 98, Jan. 2019, pp. 220-229.

* cited by examiner

DIGITAL OSCILLOSCOPE HAVING FRACTIONAL CALCULUS OPERATION AND DISPLAY FUNCTION

FIELD OF THE INVENTION

This application claims priority under the Paris Convention to Chinese Patent Application No. 202110514250.7, filed on May 12, 2021, the entirety of which is hereby incorporated by reference for all purposes as if fully set forth herein.

The present invention relates to the field of digital oscilloscope, more particularly to a digital oscilloscope having fractional calculus operation and display function.

BACKGROUND OF THE INVENTION

In recent years, fractional calculus has become a hot research area, for the scholars found that it is more accurate to describe the process of variation of a system by using fractional calculus. At present, fractional calculus has been widely used in multiple fields, such as sliding model control, multidimensional chaotic system, weak signal detection, voice encryption, digital filtering, memristor, image recognition, neuronal stimulation.

Analog circuit implementation and digital implementation of fractional calculus play very important roles in the application research of fractional order. Analog circuit implementation mainly adopts resistor, capacitor, inductor, operational amplifier etc. to construct a fractional calculus operation circuit, for example, adopting a plurality of basic electronic components to construct a memristor circuit. However, analog circuit implementation will be affected by parasitic parameters, environmental characteristics of component and distribution parameters of PCB (Printed Circuit Board), therefore, analog circuit implementation can only verify the function of fractional calculus operation, and can hardly realize a high precision of fractional calculus operation. Digital implementation has no necessity to consider the characteristics of electronic components, and can be realized by a lot of EDA (Electronic Design Automation) softwares, which significantly lowers the difficulty of digital implementation of fractional calculus operation, and accelerates the application and promotion of fractional calculus operation in multiple technical fields, such as secure communication, weak signal detection and automatic control. Therefore, digital implementation of fractional calculus operation is becoming more and more popular.

Figure 1:
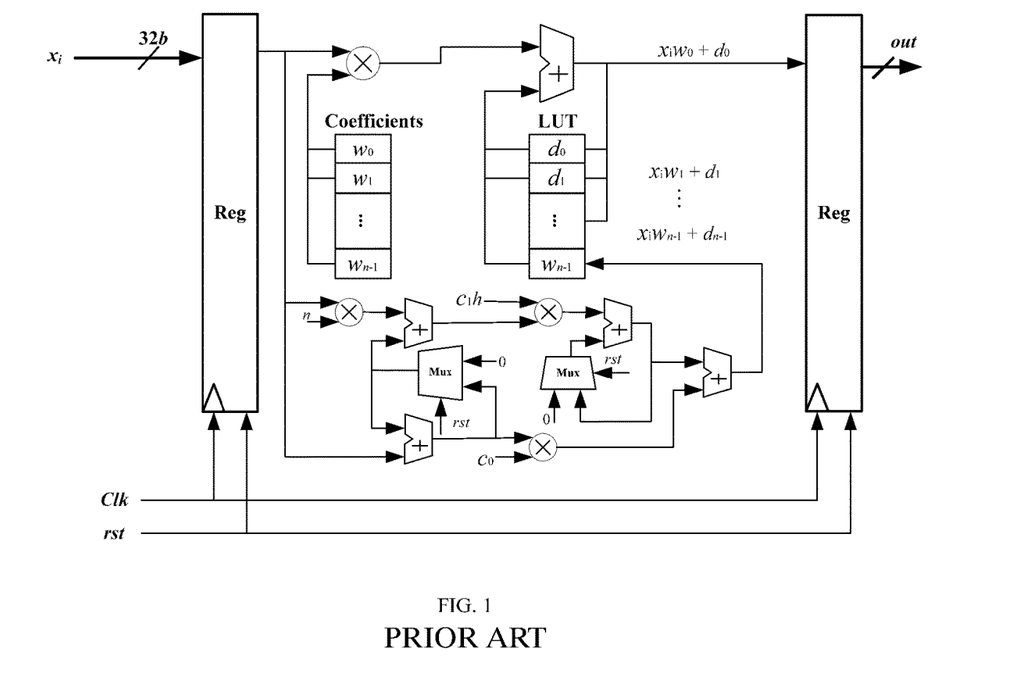
FIG. 1 is a diagram of a hardware architecture of digital implementation of fractional calculus operation in prior art.

A hardware architecture of digital implementation of fractional calculus has been published in 2017 29$^{th}$ International Conference on Microelectronics (ICM). As shown in FIG. 1, the input and output signals are 32-bits fixed point number, with 8-bits and 24-bits for the integer and the fractional part, respectively. The hardware architecture comprises two parts. The first part includes two registers, the input and output signals are respectively stored in the two registers. The multiplier, adder and look up table (LUT) between the two registers are used to realize the accumulation of multiplications of input signal $x_i$ and binomial coefficients $w_0:w_{n-1}$. In details, two look up tables (LUTs) are used in the hardware architecture, one to store the binomial coefficients from $w_0$ to $w_{n-1}$ and the other store the output of the adder from $x_iw_0+d_0:x_iw_{n-1}+d_{n-1}$. Each input value $x_i$ is multiplied with all the coefficients $w_0:w_{n-1}$ stored in the first LUT, then the results of the multiplications are added to the data $d_0:d_{n-1}$ previously stored in the second LUT. The operations from $x_iw_1+d_1:x_iw_{n-1}+d_{n-1}$ are stored in the second LUT at $d_0:d_{n-2}$. The last position $d_{n-1}$ at the second LUT is used to store the output of the second part of the hardware architecture. The result $x_iw_0+d_0$ is taken as the output at each clock cycle.

The above-mentioned digital implementation realizes fractional calculus operation at a certain extent, however, storage resource and computing ability are highly demanded.

Figure 2:
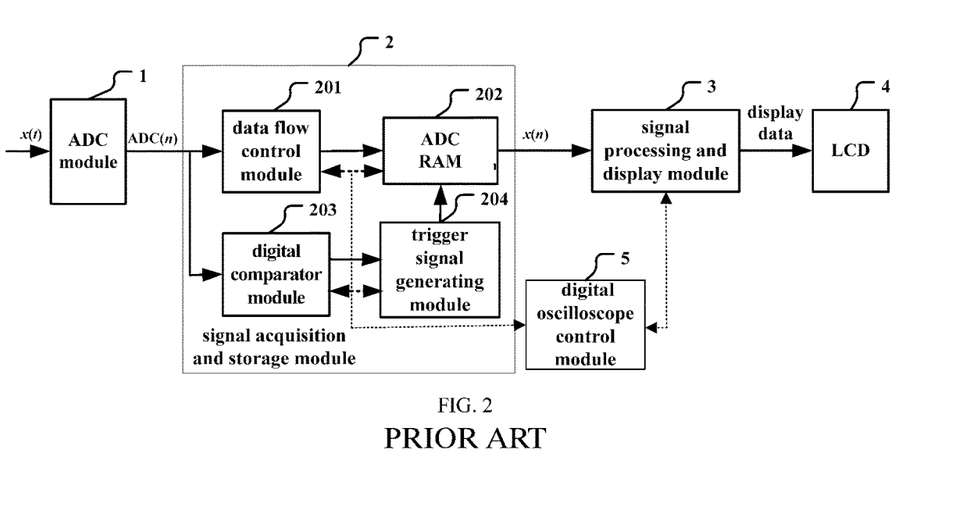
FIG. 2 is a diagram of a digital oscilloscope in prior art.

FIG. 2 is a diagram of the digital oscilloscope in prior art.

As shown in FIG. 2, digital oscilloscope comprises ADC module 1, signal acquisition and storage module 2, signal processing and display module 3, LCD 4 and digital oscilloscope control module 5.

Input signal (the signal being measured) x(t) is sampled and quantified through ADC module 1 to obtain sampled data ADC(m), which is sent to signal acquisition and storage module 2. In signal acquisition and storage module 2, sampled data ADC(m) is split into two sampled data, one sampled data is sent to digital comparator module 203, and a trigger signal is generated through trigger signal generating module 204 according to the output of digital comparator module 203, the other sampled data is sent to data flow control module 201 in which the sampled data is decimated according to a decimation coefficient D, the sampled data after decimation (acquired data) is sent to acquisition memory ADC RAM 202, where acquisition memory ADC RAM 202 is a dual port RAM, the decimation coefficient D is determined by selected time base. Before arriving at the pre trigger depth, digital oscilloscope control module 5 only performs write operation on acquisition memory ADC RAM 202; after arriving at the pre trigger depth and before generating trigger signal trig, digital oscilloscope control module 5 performs write operation and read operation simultaneously, and the speeds of write and read operations are the same; after generating trigger signal trig, digital oscilloscope control module 5 only performs write operation on acquisition memory ADC RAM 202, when acquisition memory ADC RAM 202 is stored full, which means a data acquisition is complete, oscilloscope data done signal DSO_DONE is turned from 0 to 1. And then, the data x(n) stored in acquisition memory ADC RAM 202 are sent to signal processing and display module 3 in which data x(n) is converted into a display data through a drawing thread, such as a 3D waveform mapping thread, and the display data is sent to LCD 4 for displaying.

However, the storage resource and computing ability of digital oscilloscope are very limited, at the same time, the input signal of digital oscilloscope is acquired and processed by frame, both of which limit the application of the hardware architecture, shown in FIG. 1, of digital implementation of fractional calculus operation on digital oscilloscope.

SUMMARY OF THE INVENTION

The present invention aims to overcome the deficiencies of the prior art, and provides a digital oscilloscope having fractional calculus operation and display function to realize a fractional calculus operation and display of an input signal in a digital oscilloscope.

To achieve these objectives, in accordance with the present invention, a digital oscilloscope having fractional calculus operation and display function is provided, comprising:

a digital oscilloscope control module;

an ADC module, wherein an input analog signal (a signal being measured) x(t) is sampled and quantified to obtain an sampled data ADC(m), m is the sampling point of the sampled data ADC(m);

a signal acquisition and storage module, wherein the sampled data ADC(m) is decimated according to selected time base, and then under the control of the digital oscilloscope control module, the sampled data after decimation (acquired data) is stored into the acquisition memory ADC RAM of the signal acquisition and storage module in order based on storage address according to a set pre trigger depth and trigger signal, when the acquisition memory ADC RAM is stored full, which means L acquired data is stored, the acquisition and storage is stopped, the oscilloscope data done signal DSO_DONE outputted by the acquisition memory ADC RAM is turned from 0 to 1, at this moment, the acquired data stored in the acquisition memory ADC RAM can be denoted by x(n), n is storage address, n=0, 1, 2, . . . , L−1;

a signal processing and display module;

wherein further comprising:

a fractional calculus module, which is used for reading out the acquired data x(n) from the acquisition memory ADC RAM to perform a fractional differentiation operation or a fractional integration operation and obtaining a fractional calculus result data y(n), which is sent to the signal processing and display module, in which the acquired data x(n) is turned into a display data and the display data is sent to a LCD for displaying;

the fractional calculus module comprising:

a fixed coefficient memory CO RAM, which is used for storing the L fixed coefficients c(0), c(1), c(2), . . . , c(L−1) sent from the digital oscilloscope control module, to the $j^{th}$ fixed coefficient c(j), its value is:

$$c(j) = \frac{b_j L^\alpha}{(XT_{base})^\alpha}, j = 0, 1, 2, \ldots, L-1$$

where L is the number of the pixels at the horizontal direction of the display area of the digital oscilloscope, X is the number of the divisions at the horizontal direction of the display area of the digital oscilloscope, $T_{base}$ is the time base of the digital oscilloscope, α is operation order, when α<0, the fractional calculus operation is a fractional integration operation, when α>0, the fractional calculus operation is a fractional differentiation operation, $b_j$ is a fixed parameter, its value is:

$$b_j = \left(1 - \frac{1+\alpha}{j}\right) b_{j-1}, b_0 = 1$$

N−1 D flip-flop delay units $D_1, D_2, D_3, \ldots, D_{N-1}$, wherein the output of the fixed coefficient memory CO RAM is connected to the input of the $1^{st}$ D flip-flop delay unit $D_1$, from the $2^{nd}$ D flip-flop delay unit $D_2$ on, the input of a D flip-flop delay unit is connected to the output of its previous D flip-flop delay unit;

N fractional operation units $THD_1, THD_2, THD_3, \ldots, THD_N$, wherein each fractional operation unit comprises one multiplier and one accumulator (ACC); to the $p^{th}$ fractional operation unit $THD_p$, p=1, 2, . . . , N−1, one (port A) of the two inputs of its multiplier $MULTI_p$ is connected to the acquired data x(n) outputted by the signal acquisition and storage module, another (port B) of the two inputs of its multiplier $MULTI_p$ is connected to the input of the $p^{th}$ D flip-flop delay unit $D_p$, the input of its accumulator $ACC_p$ is connected to the output of its multiplier $MULTI_p$, the output of the accumulator $ACC_p$ is taken as the output of the $p^{th}$ fractional operation unit $THD_p$; to the $N^{th}$ fractional operation unit $THD_N$, one of the two inputs of its multiplier $MULTI_N$ is connected to the acquired data x(n) outputted by the signal acquisition and storage module, another of the two inputs of its multiplier $MULTI_N$ is connected to the output of the N−$1^{th}$ D flip-flop delay unit $D_{N-1}$, the input of its accumulator $ACC_N$ is connected to the output of its multiplier $MULTI_N$;

a fractional operation results memory FO RAM, which is used for storing the operation results of the N fractional operation units $THD_1, THD_2, THD_3, \ldots, THD_N$;

a fractional operation control module FO CTRL, which is used for controlling the fractional operation, when the oscilloscope data done signal DSO_DONE is turned from 0 to 1 is detected, the fractional operation control module FO CTRL performs the following steps:

(1): initialing initializing fractional operation number i to 1, the flag i_done of the $i^{th}$ fractional calculus operation to 0, fractional operation done signal FO_DONE to 0;

2): resetting resetting the initial values of the N−1 D flip-flop delay units $D_1, D_2, D_3, \ldots, D_{N-1}$ to 0, setting the read address $ADDR_{adcram}$ of the acquisition memory ADC RAM to N*i−1, resetting the read address $ADDR_{coram}$ of the fixed coefficient memory CO RAM to 0, resetting the initial values of the accumulators of the N fractional operation units $THD_1, THD_2, THD_3, \ldots, THD_N$ to 0, resetting the write address $ADDR_{foram}$ of the fractional operation results memory FO RAM to 0;

(3): reading data to multiply and accumulate driven by a system clock clk, the fractional operation control module FO CTRL initiates a operation of reading the acquisition memory ADC RAM and a operation of reading the fixed coefficient memory CO RAM at each system clock, the total number of reading is k, k=N*i; to each reading, the read address $ADDR_{adcram}$ is subtracted by 1, and the read address $ADDR_{coram}$ is added by 1;

the data outputted by the read data port of the acquisition memory ADC RAM in chronological order are acquired data x(k−1), . . . , x(1), x(0), namely, the data sent to the port As of the multipliers of the N fractional operation units are acquired data x(k−1) at $0^{th}$ system clock, the data sent to the port As of the multipliers of the N fractional operation units are acquired data x(k−2) at $1^{st}$ system clock, the data sent to the port As of the multipliers of the N fractional operation units are acquired data x(k−2) at $2^{nd}$ system clock, and so on, the data sent to the port As of the multipliers of the N fractional operation units are acquired data x(0) at $(k-1)^{th}$ system clock;

the data outputted by the read data port of the fixed coefficient memory CO RAM in chronological order are the fixed data c(0), c(1), . . . , c(k−1), the fixed data c(0), c(1), . . . , c(k−1) are serially sent to the N−1 D flip-flop delay units $D_1, D_2, D_3, \ldots, D_{N-1}$, namely, at $0^{th}$ system clock, the data sent to the port B of the multiplier of the $1^{st}$ fractional operation unit $THD_1$ is the fixed data c(0), the data sent to the port Bs of the multipliers of the rest of the fractional operation units are 0, at $1^{st}$ system clock, the data sent to the port Bs of the multipliers of the $1^{st}$, the $2^{nd}$ fractional operation units $THD_1, THD_2$ are respectively the fixed data c(1), c(0), the data sent to the port Bs of the multipliers of the rest of the fractional operation units are 0, at $2^{nd}$ system clock, the data sent to the port Bs of the multipliers of the $1^{st}$, the $2^{nd}$ and the $3^{rd}$ fractional operation units $THD_1$, $THD_2$, $THD_2$ are respectively the fixed data c(2), c(1), c(0), the data sent to the port Bs of the multipliers of the rest of the fractional operation units are 0, and so on, until at the $(k-1)^{th}$ system clock, the data sent to the port Bs of the multipliers of the N fractional operation units $THD_1$, $THD_2$, $THD_3$, . . . , $THD_N$ are respectively c(k−1), . . . , c(2), c(1), c(0);

after each reading, all the N fractional operation units $THD_1$, $THD_2$, $THD_3$, . . . , $THD_N$ perform a multiplying operation and an accumulating operation in turn, when the number of the accumulations reaches k, the $i^{th}$ fractional calculus operation is accomplished, the $i^{th}$ fractional operation done signal i_done is turned from 0 to 1;

(4): storing the results of the $i^{th}$ fractional calculus operation when the $i^{th}$ fractional operation done signal i_done is turned from 0 to 1 is detected, the outputs of the N fractional operation units $THD_1$, $THD_2$, $THD_3$, . . . , $THD_N$ are taken as the results y(k−1), y(k−2), y(k−3), . . . , y(k−N) of the $i^{th}$ fractional calculus operation and merged into a merged data, the merged data are stored into the fractional operation results memory FO RAM at address $ADDR_{foram}$ under the same system clock clk;

(5) judging whether a frame of acquired data, namely L acquired data are calculated judging whether the current fractional operation number i is less than L/N, if yes, the write address $ADDR_{foram}$ is added by 1, the current fractional operation number i is added by 1, the $i^{th}$ fractional operation done signal i_done is set to 1, then returning to step (2); if not, the fractional operation done signal FO_DONE is set to 1, stopping the fractional calculus operation;

the digital oscilloscope control module is detecting the fractional operation done signal FO_DONE, when the fractional operation done signal FO_DONE is turned from 0 to 1 is detected, the digital oscilloscope control module performs the following steps:

(1): sending the acquired data x(n), n=1, 2, . . . , L−1 stored in the acquisition memory ADC RAM and the fractional calculus result data y(n), n=1, 2, . . . , L−1 stored the fractional operation results memory FO RAM to signal processing and display module, in which the acquired data x(n) and the fractional calculus result data y(n) are respectively converted into a display data through a drawing thread, and the two display data are sent to LCD for displaying;

(2): resetting the oscilloscope data done signal DSO_DONE and the fractional operation done signal FO_DONE to 0 to enable the signal acquisition and storage module and the fractional calculus module.

The objectives of the present invention are realized as follows:

In the present invention, a fractional calculus module has been added into the traditional digital oscilloscope for reading the acquired data x(n) from the acquisition memory ADC RAM to perform a fractional differentiation or a fractional integration. In the fractional calculus module, the fixed coefficients, which are calculated according the parameters and settings of a digital oscilloscope, are stored into a fixed coefficient memory CO RAM, the fixed coefficients are outputted to N fractional operation units through N−1 D flip-flop delay units to multiply with the acquired data x(n) and then be accumulated, thus N fractional calculus results are obtained. In this way, N fractional calculus results can be obtained by performing L/N fractional calculus operations. N fractional calculus results are sent to a signal processing and display module, in which they are converted into a display data through a drawing thread, and the display data are sent to LCD for displaying, thus the fractional calculus operation and display of a input signal in a digital oscilloscope is realized. Meanwhile, the N fractional operation units adopt a module design of multiplier and accumulator and a parallel operation mode to improve real time calculation performance, which significantly shortens the data processing time of the digital oscilloscope.

In addition, the present invention further has the following advantageous features:

(1) It has realized the dynamic allocation of waveform capture rate and hardware resource of a digital oscilloscope. If a higher waveform capture rate is needed, the more fractional operation units are designed in the digital oscilloscope. If a less hardware is needed, the less fractional operation units are designed in the digital oscilloscope.

(2) It has realized the dynamic configuring of the fractional operation parameters of a digital oscilloscope. Both of the operation step h ($h=XT_{base}/L$) and the operation order α can be configured dynamically, the relevant parameters are calculated by the digital oscilloscope control module, and sent to a fixed coefficient memory CO RAM, thus reducing the parameter calculation in fractional operation, and saving more logic resources. Moreover, the length of fractional operation is fixed at the number of the pixels at the horizontal direction of the display area of the digital oscilloscope, which guarantees the display quality of the fractional calculus, shortens the operation time of the fractional calculus and saves the logic resource.

(3) It has improved the amplitude accuracy and the phase accuracy of waveform displaying. In prior art, the waveform after fractional calculus operation is outputted by an ADC, and then inputted into a channel of a digital oscilloscope for measurement. So the output range and resolution of the ADC, the input voltage range of analog channel, the time delay between analog channels, the noise in circuits in the digital oscilloscope will influence the amplitude and phase of the waveform after fractional calculus operation. However, in the present invention, the phase error between the waveforms before and after fractional calculus operation is only one system clock period, so the phase accuracy can be improved. In addition, the transformation of the waveform after fractional calculus operation is processed in digital domain, and can't be influenced by noise, so the amplitude accuracy can also be improved.

BRIEF DESCRIPTION OF THE DRAWING

The above and other objectives, features and advantages of the present invention will be more apparent from the following detailed description taken in conjunction with the accompanying drawings, in which.

DETAILED DESCRIPTION OF THE PREFERRED EMBODIMENT

Hereinafter, preferred embodiments of the present invention will be described with reference to the accompanying drawings. It should be noted that the similar modules are designated by similar reference numerals although they are illustrated in different drawings. Also, in the following description, a detailed description of known functions and configurations incorporated herein will be omitted when it may obscure the subject matter of the present invention.

The fractional calculus operation in the present invention is realized according to the definition of G-L Equation. Let x(t) as an analog signal of continuous time, G-L fractional calculus operation is defined as follows:

$$D^\alpha x(t) = \lim_{h \to 0} h^{-\alpha} \sum_{j=0}^{\infty} (-1)^j \binom{n}{j} x(t-jh) \quad (1)$$

where D stands for fractional operator, $\alpha$ is operation order, when $\alpha<0$, the operation of fractional calculus is a fractional integration operation, when $\alpha>0$, the operation of fractional calculus is a fractional differentiation operation, h is operation step, (n/h) satisfies the following condition:

$$\binom{n}{j} = C_n^j = \frac{n!}{j!(n-j)!}$$

So, when $t_1-t_0=+\infty$, equation (1) needs to perform infinite calculations, that is to say, large amount of data are needed to store, which will consume large amount of storage resources. But the storage resources generally are limited, and large amount of data calculations need more operation time. Therefore, fractional calculus operation can be performed only to the signal of finite length. According to finite length calculation principle, equation (1) can be reformulated as follows:

$$_{t_0}D_{t_1}^\alpha x(t) = \lim_{h \to 0} h^{-\alpha} \sum_{j=0}^{\frac{t_1-t_0}{h}} (-1)^j \binom{n}{j} x(t-jh) \quad (2)$$

where $t_0$ and $t_1$ respectively are the starting time and the ending time. When fractional calculus operation is implemented digitally, the signal is discretized, equation (2) can be further reformulated as follows:

$$_{t_0}D_{t_1}^\alpha x[n] = \lim_{h \to 0} \frac{1}{h^\alpha} \sum_{j=0}^{\lceil \frac{t_1-t_0}{h} \rceil} b_j x[n-jh] \quad (3)$$

$$b_j = \left(1 - \frac{1+\alpha}{j}\right) b_{j-1}, b_0 = 1$$

where $\lceil \; \rceil$ stands for round up.

A digital oscilloscope has X divisions and L pixels at the horizontal direction of the display area, its time base is $T_{base}$, so the sampling interval $T_{S\_LCD}$ of waveform display is $(X*T_{base})/L$. In the present invention, combining with the display theory of digital oscilloscope, the sampling interval $T_{S\_LCD}$ of waveform display is taken as the operation step h. To the displaying of a frame of waveform, there has:

$$\left\lfloor \frac{t_1-t_0}{h} \right\rfloor \geq L$$

When the operation order $\alpha$ and the time base $T_{base}$ of digital oscilloscope is fixed, the parameters $b_j$ and $1/h^\alpha$ are fixed, then there has:

$$c(j) = \frac{b_j}{h^\alpha}, j = 0, 1, 2, 3, \ldots, L-1$$

Equation (3) can be rewritten as follows:

$$y[n] = \sum_{j=0}^{L-1} c[j]x[n-j] \text{ where} \quad (4)$$

$$c(j) = b_j T_{S\_LCD}^{-\alpha} = \frac{b_j L^\alpha}{(XT_{base})^\alpha}, j = 0, 1, 2, \ldots, L-1.$$

Then we can realize a fractional calculus operation of fixed L points in a digital oscilloscope by performing multiplication and accumulation to an acquired data.

Figure 3:
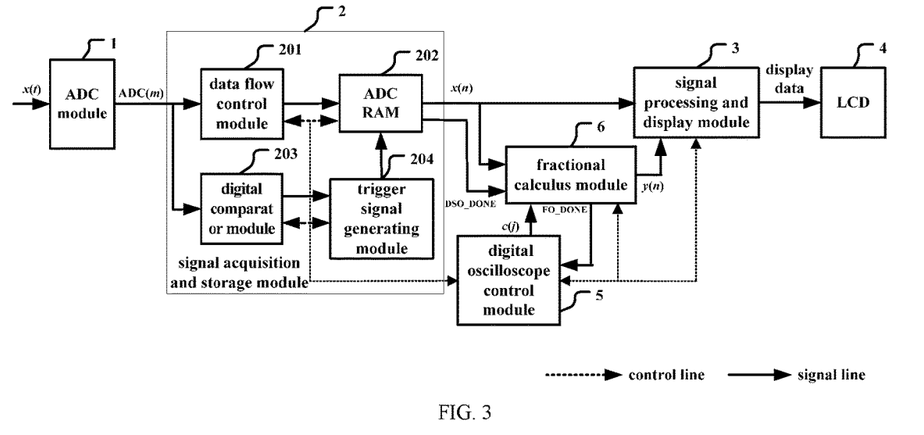
FIG. 3 is a diagram of a digital oscilloscope having fractional calculus operation and display function in accordance with the present invention.

FIG. 3 is a diagram of a digital oscilloscope having fractional calculus operation and display function in accordance with the present invention.

In one embodiment, as shown in FIG. 3, a digital oscilloscope having fractional calculus operation and display function in accordance with the present invention comprises an ADC module 1, a signal acquisition and storage module 2, a signal processing and display module 3, a LCD 4, a digital oscilloscope control module 5 and a fractional calculus module 6, where the fractional calculus module 6 is the innovation of the present invention.

An input analog signal (a signal being measured or a signal under measurement) x(t) is sampled and quantified by the ADC module 1 to obtain an sampled data ADC(m), m is the sampling point of the sampled data ADC(m). In the signal acquisition and storage module 2, the sampled data ADC(m) is decimated according to selected time base, and then under the control of the digital oscilloscope control module 5, the sampled data after decimation (acquired data) is stored into the acquisition memory ADC RAM 202 of the signal acquisition and storage module 2 in order based on storage address according to a set pre trigger depth and trigger signal. When the acquisition memory ADC RAM 202 is stored full, which means L acquired data is stored, the acquisition and storage is stopped, the oscilloscope data done signal DSO_DONE outputted by the acquisition memory ADC RAM is turned from 0 to 1. At this moment, the acquired data stored in the acquisition memory ADC RAM can be denoted by x(n), n is storage address, n=0, 1, 2, . . . , L−1. The signal acquisition and storage of digital oscilloscope belongs to the prior art and is not detailed here.

In the present invention, a fractional calculus module 6 is specially innovated, which is used for reading out the acquired data x(n) from the acquisition memory ADC RAM 202 to perform a fractional differentiation operation or a fractional integration operation and obtaining a fractional calculus result data y(n), which is sent to the signal processing and display module 3, in which the acquired data x(n) is turned into a display data and the display data is sent to the LCD 4 for displaying.

Figure 4:
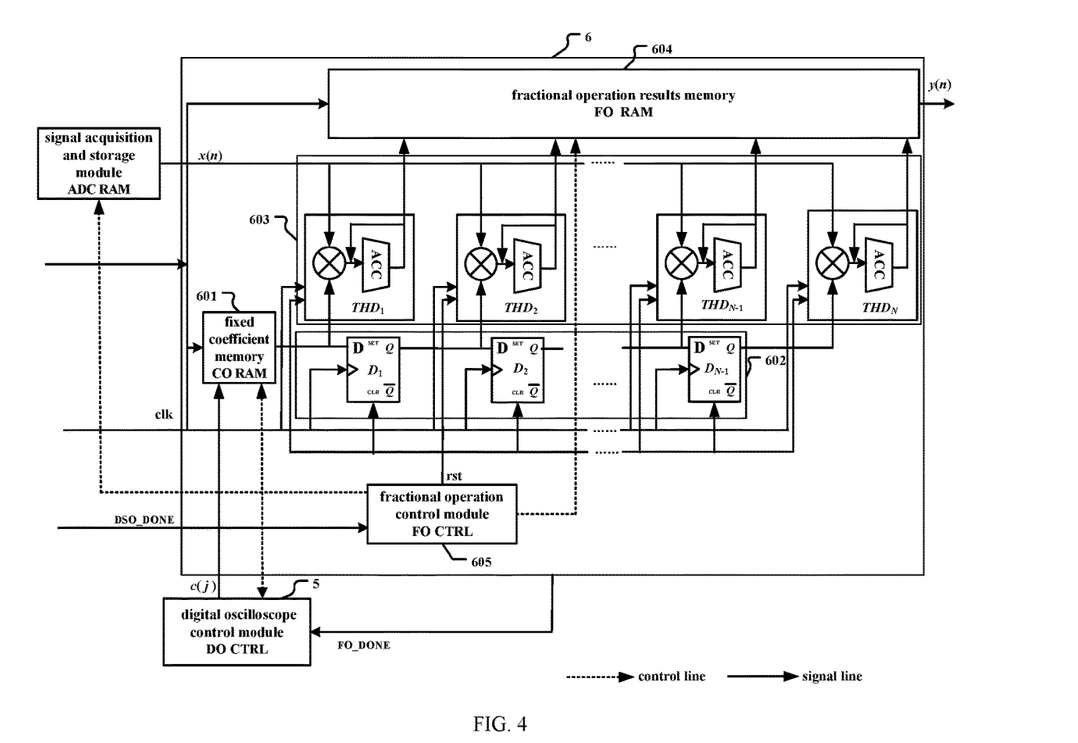
FIG. 4 is a diagram of the fractional operation module shown in FIG. 3.

In the embodiment, as shown in FIG. 4, the fractional calculus module 6 comprises a fixed coefficient memory CO RAM 601, N−1 D flip-flop delay units $D_1, D_2, D_3, \ldots, D_{N-1}$ 602, N fractional operation units $THD_1, THD_2, THD_3, \ldots, THD_N$ 603, a fractional operation results memory FO RAM 604 and a fractional operation control module FO CTRL 605.

The fixed coefficient memory CO RAM 601 is used for storing the L fixed coefficients $c(0), c(1), c(2), \ldots, c(L-1)$ sent from the digital oscilloscope control module 5. To the $j^{th}$ fixed coefficient c(j), its value is:

$$c(j) = \frac{b_j L^\alpha}{(XT_{base})^\alpha}, j = 0, 1, 2, \ldots, L-1 \quad (5)$$

where L is the number of the pixels at the horizontal direction of the display area of the digital oscilloscope, X is the number of the divisions at the horizontal direction of the display area of the digital oscilloscope, $T_{base}$ is the time base of the digital oscilloscope, α is operation order, when α<0, the fractional calculus operation is a fractional integration operation, when α>0, the fractional calculus operation is a fractional differentiation operation, $b_j$ is a fixed parameter, its value is:

$$b_j = \left(1 - \frac{1+\alpha}{j}\right) b_{j-1}, b_0 = 1 \quad (6)$$

The output of the fixed coefficient memory CO RAM 601 is connected to the input of the $1^{st}$ D flip-flop delay unit $D_1$, from the $2^{nd}$ D flip-flop delay unit $D_2$ on, the input of a D flip-flop delay unit is connected to the output of its previous D flip-flop delay unit.

Each fractional operation unit comprises one multiplier and one accumulator (ACC). To the $p^{th}$ fractional operation unit $THD_p$, p=1, 2, . . . , N−1, one (port A) of the two inputs of its multiplier $MULTI_p$ is connected to the acquired data x(n) outputted by the signal acquisition and storage module 2, another (port B) of the two inputs of its multiplier $MULTI_p$ is connected to the input of the $p^{th}$ D flip-flop delay unit $D_p$, the input of its accumulator $ACC_p$ is connected to the output of its multiplier $MULTI_p$, the output of the accumulator $ACC_p$ is taken as the output of the $p^{th}$ fractional operation unit $THD_p$; to the $N^{th}$ fractional operation unit $THD_N$, one of the two inputs of its multiplier $MULTI_N$ is connected to the acquired data x(n) outputted by the signal acquisition and storage module 2, another of the two inputs of its multiplier $MULTI_N$ is connected to the output of the N−$1^{th}$ D flip-flop delay unit $D_{N-1}$, the input of its accumulator $ACC_N$ is connected to the output of its multiplier $MULTI_N$.

The fractional operation results memory FO RAM 604 is used for storing the operation results of the N fractional operation units $THD_1, THD_2, THD_3, \ldots, THD_N$.

The fractional operation control module FO CTRL 605 is used for controlling the fractional operation. When the oscilloscope data done signal DSO_DONE is turned from 0 to 1 is detected, the fractional operation control module FO CTRL performs the following steps:

(1): Initialing

Initializing fractional operation number i to 1, the flag i_done of the $i^{th}$ fractional calculus operation to 0, fractional operation done signal FO_DONE to 0.

(2): Resetting

Resetting the initial values of the N−1 D flip-flop delay units $D_1, D_2, D_3, \ldots, D_{N-1}$ 602 to 0, setting the read address $ADDR_{adcram}$ of the acquisition memory ADC RAM 202 to N*i−1, resetting the read address $ADDR_{coram}$ of the fixed coefficient memory CO RAM 601 to 0, resetting the initial values of the accumulators of the N fractional operation units $THD_1, THD_2, THD_3, \ldots, THD_N$ 603 to 0, resetting the write address $ADDR_{foram}$ of the fractional operation results memory FO RAM 602 to 0.

(3): Reading data to multiply and accumulate

Driven by a system clock clk, the fractional operation control module FO CTRL 605 initiates a operation of reading the acquisition memory ADC RAM 202 and a operation of reading the fixed coefficient memory CO RAM 601 at each system clock, the total number of reading is k, k=N*i; to each reading, the read address $ADDR_{adcram}$ is subtracted by 1, and the read address $ADDR_{coram}$ is added by 1.

The data outputted by the read data port of the acquisition memory ADC RAM 202 in chronological order are acquired data x(k−1), . . . , x(1), x(0), namely, the data sent to the port As of the multipliers of the N fractional operation units $THD_1, THD_2, THD_3, \ldots, THD_N$ 603 are acquired data x(k−1) at $0^{th}$ system clock, the data sent to the port As of the multipliers of the N fractional operation units $THD_1, THD_2, THD_3, \ldots, THD_N$ 603 are acquired data x(k−2) at $1^{st}$ system clock, the data sent to the port As of the multipliers of the N fractional operation units $THD_1, THD_2, THD_3, \ldots, THD_N$ 603 are acquired data x(k−2) at $2^{nd}$ system clock, and so on, the data sent to the port As of the multipliers of the N fractional operation units $THD_1, THD_2, THD_3, \ldots, THD_N$ 603 are acquired data x(0) at $(k-1)^{th}$ system clock.

The data outputted by the read data port of the fixed coefficient memory CO RAM 601 in chronological order are the fixed data c(0), c(1), . . . , c(k−1), the fixed data c(0), c(1), . . . , c(k−1) are serially sent to the N−1 D flip-flop delay units $D_1, D_2, D_3, \ldots, D_{N-1}$ 602, namely, at $0^{th}$ system clock, the data sent to the port B of the multiplier of the $1^{st}$ fractional operation unit $THD_1$ is the fixed data c(0), the data sent to the port Bs of the multipliers of the rest of the fractional operation units are 0, at $1^{st}$ system clock, the data sent to the port Bs of the multipliers of the $1^{st}$, the $2^{nd}$ fractional operation units $THD_1, THD_2$ are respectively the fixed data c(1), c(0), the data sent to the port Bs of the multipliers of the rest of the fractional operation units are 0, at $2^{nd}$ system clock, the data sent to the port Bs of the multipliers of the $1^{st}$, the $2^{nd}$ and the $3^{rd}$ fractional operation units $THD_1, THD_2, THD_2$ are respectively the fixed data c(2), c(1), c(0), the data sent to the port Bs of the multipliers of the rest of the fractional operation units are 0, and so on, until at the $(k-1)^{th}$ system clock, the data sent to the port Bs of the multipliers of the N fractional operation units $THD_1, THD_2, THD_3, \ldots, THD_N$ are respectively c(k−1), . . . , c(2), c(1), c(0).

After each reading, all the N fractional operation units $THD_1, THD_2, THD_3, \ldots, THD_N$ 603 perform a multiplying operation and an accumulating operation in turn, when the number of the accumulations reaches k, the $i^{th}$ fractional calculus operation is accomplished, the $i^{th}$ fractional operation done signal i_done is turned from 0 to 1;

(4): Storing the results of the $i^{th}$ fractional calculus operation

When the $i^{th}$ fractional operation done signal i_done is turned from 0 to 1 is detected, the outputs of the N fractional operation units $THD_1$, $THD_2$, $THD_3$, . . . , $THD_N$ 603 are taken as the results y(k−1)y(k−2), y(k−3), . . . , y(k−N) of the $i^{th}$ fractional calculus operation and merged into a merged data, the merged data are stored into the fractional operation results memory FO RAM 604 at address $ADDR_{foram}$ under the same system clock clk;

(5) Judging whether a frame of acquired data, namely L acquired data are calculated Judging whether the current fractional operation number i is less than L/N, if yes, the write address $ADDR_{foram}$ is added by 1, the current fractional operation number i is added by 1, the $i^{th}$ fractional operation done signal i_done is set to 1, then returning to step (2); if not, the fractional operation done signal FO_DONE is set to 1, stopping the fractional calculus operation.

The results of the $i^{th}$ fractional calculus operation (Ni system clock) of the N fractional operation units are as follows:

TABLE 1

| Fractional operation unit | System clock | | | | | |
|---|---|---|---|---|---|---|
| | $clk_0$ | $clk_1$ | . . . | $clk_{Ni-2}$ | $clk_{Ni-1}$ | output |
| $THD_1$ | c(0)*x(Ni − 1) | c(1)*x(Ni − 2) | . . . | c(Ni − 2)*x(1) | c(Ni − 1)*x(0) | y(Ni − 1) |
| $THD_2$ | 0*x(Ni − 1) | c(0)*x(Ni − 2) | . . . | c(Ni − 3)*x(1) | c(Ni − 2)*x(0) | y(Ni − 2) |
| $THD_3$ | 0*x(Ni − 1) | 0*x(Ni − 2) | . . . | c(Ni − 4)*x(1) | c(Ni − 3)*x(0) | y(Ni − 3) |
| . . . | . . . | . . . | . . . | . . . | . . . | . . . |
| $THD_N$ | 0*x(Ni − 1) | 0*x(Ni − 2) | . . . | c(Ni − N + 1)*x(1) | c(Ni − N)*x(0) | y(Ni − N) |

The digital oscilloscope control module 5 is detecting the fractional operation done signal FO_DONE, when the fractional operation done signal FO_DONE is turned from 0 to 1 is detected, the digital oscilloscope control module performs the following steps:

(1): Sending the acquired data x(n), n=1, 2, . . . , L−1 stored in the acquisition memory ADC RAM 202 and the fractional calculus result data y(n), n=1, 2, . . . , L−1 stored the fractional operation results memory FO RAM 604 to signal processing and display module 3, in which the acquired data x(n) and the fractional calculus result data y(n) are respectively converted into a display data through a drawing thread, and the two display data are sent to LCD 4 for displaying.

In the embodiment, after sending the acquired data x(n) and the fractional calculus result data y(n) to signal processing and display module 3, the vertical sensitivity corresponding to the acquired data x(n) is multiplied with the number of the vertical divisions of the display area to obtain a display range R1, the vertical sensitivity corresponding to the fractional calculus result data y(n) is multiplied with the number of the vertical divisions of the display area to obtain another display range R2. The range of the acquired data x(n) is $[0,2^v-1]$, where v is the digit number of the ADC module, the data range needed by the drawing thread is:

$$\left[-\frac{R_1}{2}, \frac{R_1}{2}\right]$$

Therefore, it is needed to perform a normalization of data displaying to obtain the data $d_x(n)$, $d_y(n)$ which can be recognized by the drawing thread. The normalization of the acquired data x(n) is:

$$d_x(n) = \left(\frac{x(n)}{2^v - 1} - 0.5\right) \times R_1$$

The normalization of the fractional calculus result data y(n) is:

$$d_y(n) = \left(\frac{y(n)}{(2^v - 1) \times R_2/R_1} - 0.5\right) \times R_2$$

The data $d_x(n)$ and $d_y(n)$ are sent to a drawing thread, through which the data $d_x(n)$ and $d_y(n)$ are respectively converted into a display data, and the two display data are sent to LCD 4 for displaying.

(2): Resetting the oscilloscope data done signal DSO_DONE and the fractional operation done signal FO_DONE to 0 to enable the signal acquisition and storage module and the fractional calculus module.

The digital oscilloscope having fractional calculus operation and display function in accordance with present invention operates as follows:

Step S1: entering the display interface of fractional calculus operation through the interface operation of user;

Step S2: setting the time base $T_{base}$ and the operation order α of the digital oscilloscope though the interface operation of user;

Step S3: the digital oscilloscope control module obtains the time base $T_{base}$ and the operation order α, and calculates the L fixed coefficients c(1), c(1), c(2), . . . , c(L−1) according to equation (5);

Step S4: storing the L fixed coefficients c(0), c(1), c(2), . . . , c(L−1) into the fixed coefficient memory CO RAM 601;

Step S5: obtaining the instructions of acquisition (including but not limited to trigger level, input sensitivity, pretrigger depth, coupling mode, trigger channel, time base) through the interface operation of user, and generating corresponding command to set the digital oscilloscope, setting the oscilloscope data done signal DSO_DONE and the fractional operation done signal FO_DONE to 0;

Step S6: enabling signal acquisition function and fractional calculus operation function, namely enabling the signal acquisition and storage module and the fractional calculus module;

Step S7: input analog signal (the signal being measured or the signal under measurement) x(t) is sampled and quantified by the ADC module 1 to obtain sampled data ADC(m), m is sampling point; in the signal acquisition and storage module 2, the sampled data ADC(m) is split into two sampled data, one sampled data is sent to digital comparator module 203, and a trigger signal is generated through trigger signal generating module according to the output of digital comparator module 203, the other sampled data is sent to data flow control module 201 in which the sampled data is decimated according to a decimation coefficient D, the sampled data after decimation (acquired data) is sent to acquisition memory ADC RAM 202, where acquisition memory ADC RAM 202 is a dual port RAM, the decimation coefficient D is determined by selected time base. Before arriving at the pre trigger depth, digital oscilloscope control module 5 only performs write operation on acquisition memory ADC RAM 202; after arriving at the pre trigger depth and before generating trigger signal trig, digital oscilloscope control module 5 performs write operation and read operation simultaneously, and the speeds of write and read operations are the same; after generating trigger signal trig, digital oscilloscope control module 5 only performs write operation on acquisition memory ADC RAM 202, when acquisition memory ADC RAM 202 is stored full, which means a data acquisition is complete, oscilloscope data done signal DSO_DONE is turned from 0 to 1.

Step S8: in the fractional calculus module 6, when the oscilloscope data done signal DSO_DONE is turned from 0 to 1 is detected by the fractional operation control module FO CTRL 605, the fractional operation control module FO CTRL performs initialing, resetting, reading data to multiply and accumulate, storing the results of the $i^{th}$ fractional operation, judging and returning, until a frame of acquired data, namely L acquired data are calculated.

Step S9: in digital oscilloscope control module 5, when the fractional operation done signal FO_DONE is turned from 0 to 1 is detected, it sends the fractional calculus result data y(n), n=1, 2, ..., L−1 to signal processing and display module 3, in which the fractional calculus result data y(n) is converted into a display data through a drawing thread, and the display data are sent to LCD 4 for displaying. More details are as follows:

After sending the acquired data x(n) and the fractional calculus result data y(n) to signal processing and display module 3, the vertical sensitivity corresponding to the acquired data x(n) is multiplied with the number of the vertical divisions of the display area to obtain a display range R1, the vertical sensitivity corresponding to the fractional calculus result data yn) is multiplied with the number of the vertical divisions of the display area to obtain another display range R2. Then the acquired data x(n) is normalized as data $d_x(n)$:

$$d_x(n) = \left( \frac{x(n)}{2^v - 1} - 0.5 \right) \times R_1$$

The fractional calculus result data y(n) is normalized as data $d_y(n)$:

$$d_y(n) = \left( \frac{y(n)}{(2^v - 1) \times R_2/R_1} - 0.5 \right) \times R_2$$

Lastly, the data $d_x(n)$ and $d_y(n)$ are sent to a drawing thread, through which the data $d_x(n)$ and $d_y(n)$ are respectively converted into a display data, and the two display data are sent to LCD 4 for displaying.

And resetting the oscilloscope data done signal DSO_D-ONE and the fractional operation done signal FO_DONE to 0 to enable the signal acquisition and storage module and the fractional calculus module.

Example

In the present example, the input analog signal is a sine wave with the frequency of 500 KHz and the amplitude of 1V, the number of the pixels at the horizontal direction of the display area of the digital oscilloscope is 1000 (namely L=1000), the number of the divisions at the horizontal direction of the display area of the digital oscilloscope is 10 (namely X=10), the number of the pixels at the vertical direction of the display area of the digital oscilloscope is 800 (namely L=1000), the number of the divisions at the vertical direction of the display area of the digital oscilloscope is 8. In a specific implementation, the data acquisition and the fractional calculus operation are realized by a FPGA (model: XC7K160T-2FFG676I), the model of the ADC is AD9628, the number of the channels of the ADC is 2, the sampling rate of the ADC is configured at 100 MSPS through the FPGA.

In the present example, the time base $T_{base}$=1us/div, and the operation order α=0.5, namely the operation of fractional calculus operation is a fractional differentiation operation.

In the present example, the number of the fractional operation units is 4, namely N=4. The running states of the first round of operations of the 4 fractional operation units $THD_1$, $THD_2$, $THD_3$, $THD_4$ are shown in Table 2:

TABLE 2

| Fractional operation unit | System clock | | | | |
| --- | --- | --- | --- | --- | --- |
| | $clk_0$ | $clk_1$ | $clk_2$ | $clk_3$ | output |
| $THD_1$ | c(0)*x(3) | c(1)*x(2) | c(2)*x(1) | c(3)*x(0) | y(3) |
| $THD_2$ | 0*x(3) | c(0)*x(2) | c(1)*x(1) | c(2)*x(0) | y(2) |
| $THD_3$ | 0*x(3) | 0*x(2) | c(0)*x(1) | c(1)*x(0) | y(1) |
| $THD_4$ | 0*x(3) | 0*x(2) | 0*x(1) | c(0)*x(0) | y(0) |

The running states of the second round of operations of the 4 fractional operation units $THD_1$, $THD_2$, $THD_3$, $THD_4$ are shown in Table 3:

TABLE 3

| Fractional operation unit | System clock | | | | | |
| --- | --- | --- | --- | --- | --- | --- |
| | $clk_0$ | $clk_1$ | ... | $clk_6$ | $clk_7$ | output |
| $THD_1$ | c(0)*x(7) | c(1)*x(6) | ... | c(6)*x(1) | c(7)*x(0) | y(7) |
| $THD_2$ | 0*x(7) | c(0)*x(6) | ... | c(5)*x(1) | c(6)*x(0) | y(6) |
| $THD_3$ | 0*x(7) | 0*x(6) | ... | c(4)*x(1) | c(5)*x(0) | y(5) |
| $THD_4$ | 0*x(7) | 0*x(6) | ... | c(3)*x(1) | c(4)*x(0) | y(4) |

The running states of the $250^{th}$ round of operations of the 4 fractional operation units $THD_1$, $THD_2$, $THD_3$, $THD_4$ are shown in Table 4:

TABLE 4

| Fractional operation unit | System clock | | | | | output |
|---|---|---|---|---|---|---|
| | $clk_0$ | $clk_1$ | ... | $clk_{998}$ | $clk_{999}$ | |
| $THD_1$ | c(0)*x(999) | c(1)*x(998) | ... | c(998)*x(1) | c(999)*x(0) | y(999) |
| $THD_2$ | 0*x(999) | c(0)*x(998) | ... | c(997)*x(1) | c(998)*x(0) | y(998) |
| $THD_3$ | 0*x(999) | 0*x(998) | ... | c(996)*x(1) | c(997)*x(0) | y(997) |
| $THD_4$ | 0*x(999) | 0*x(998) | ... | c(995)*x(1) | c(996)*x(0) | y(996) |

Figure 5:
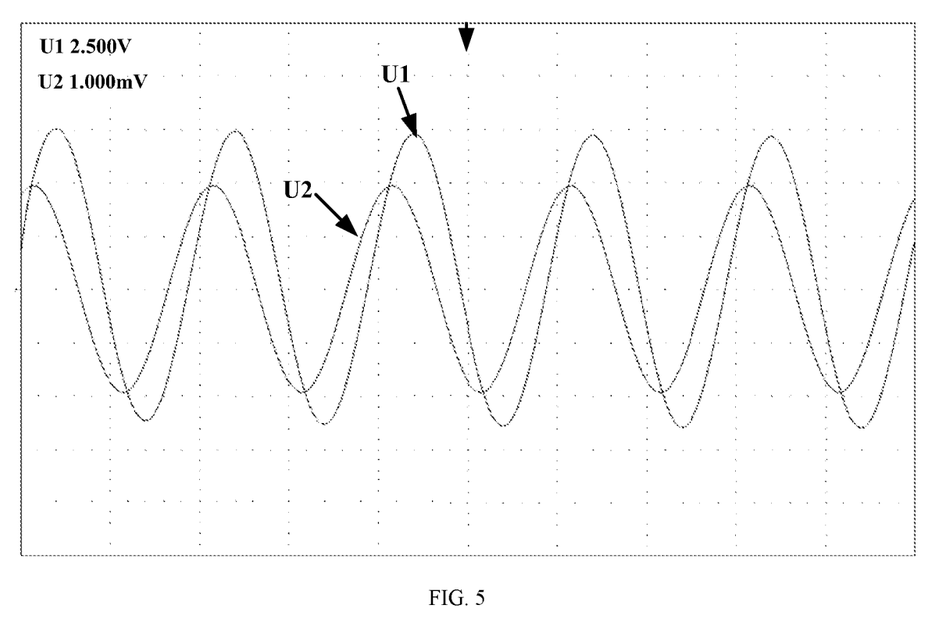
FIG. 5 is a waveform comparison graph of a acquired data and the corresponding fractional operation result data, where U1 is the oscillogram of the acquired data, U2 is the oscillogram of corresponding fractional operation result data.

In the present example, after a fractional calculus operation is completed, the waveforms of the acquired data x(n) and the fractional calculus result data y(n) are shown in FIG. 5, where U1 is the waveform of the acquired data x(n), its vertical sensitivity is 0.5V/div, vertical range is 5V, U2 is the waveform of the fractional calculus result data y(n), its vertical sensitivity is 0.2 mV/div, vertical range is 2 mV. As can be seen from FIG. 5, for the input signal is a sine waveform, the fractional calculus result is also a sine waveform, and its phase is advanced than that of the input signal, which shows that the fractional calculus operation is realized.

While illustrative embodiments of the invention have been described above, it is, of course, understand that various modifications will be apparent to those of ordinary skill in the art. Such modifications are within the spirit and scope of the invention, which is limited and defined only by the appended claims.

What is claimed is:

1. A digital oscilloscope having fractional calculus operation and display function, comprising:
  a digital oscilloscope controller;
  an analog to digital converter (ADC), wherein an input analog signal (a signal being measured) x(t) is sampled and quantified to obtain a sampled data ADC(m), m is the sampling point of the sampled data ADC(m);
  a signal acquisition and storage circuitry, wherein the sampled data ADC(m) is decimated according to a predetermined selected time base, and then under the control of the digital oscilloscope controller, the sampled data after decimation (acquired data) is stored into an acquisition memory ADC RAM of the signal acquisition and storage circuitry in order based on storage address according to a set pre trigger depth and trigger signal, when the acquisition memory ADC RAM is stored full, which means L acquired data is stored, the acquisition and storage is stopped, an oscilloscope data done signal DSO_DONE outputted by the acquisition memory ADC RAM is turned from 0 to 1, at this moment, the acquired data stored in the acquisition memory ADC RAM can be denoted by x(n), 1 is storage address, n=0, 1, 2, . . . , L−1;
  a signal processing and display circuitry; and
  a fractional calculus circuitry, which is used for reading out the acquired data x(n) from the acquisition memory ADC RAM to perform a fractional differentiation operation or a fractional integration operation and obtaining a fractional calculus result data y(7), which is sent to the signal processing and display circuitry, in which the acquired data x(n) is turned into a display data and the display data is sent to a LCD for displaying;
  the fractional calculus circuitry comprising:
  a fixed coefficient memory CO RAM, which is used for storing L fixed coefficients c(0),c(1),c(2), . . . , c(L−1) sent from the digital oscilloscope controller, to the $j^{th}$ fixed coefficient c(j), its value is:

$$c(j) = \frac{b_j L^\alpha}{(XT_{base})^\alpha}, j = 0, 1, 2, \ldots, L-1$$

where L is the number of the pixels at the horizontal direction of the display area of the digital oscilloscope, X is the number of the divisions at the horizontal direction of the display area of the digital oscilloscope, $T_{base}$ is the time base of the digital oscilloscope, $\alpha$ is operation order, when $\alpha < 0$, the fractional calculus operation is a fractional integration operation, when $\alpha > 0$, the fractional calculus operation is a fractional differentiation operation, $b_j$ is a fixed parameter, its value is:

$$b_j = \left(1 - \frac{1+\alpha}{j}\right) b_{j-1}, b_0 = 1$$

N−1 D flip-flop delay units $D_1, D_2, D_3, \ldots, D_{N-1}$, wherein the output of the fixed coefficient memory CO RAM is connected to the input of the $1^{st}$ D flip-flop delay unit $D_1$, from the $2^{nd}$ D flip-flop delay unit $D_2$ on, the input of a D flip-flop delay unit is connected to the output of its previous D flip-flop delay unit;
  N fractional operation units $THD_1, THD_2, THD_3, \ldots, THD_N$, wherein each fractional operation unit comprises one multiplier and one accumulator (ACC); to the $p^{th}$ fractional operation unit $THD_p$, p=1,2, . . . ,N−1, one (port A) of the two inputs of its multiplier $MULTI_p$ is connected to the acquired data x(n) outputted by the signal acquisition and storage circuitry, another (port B) of the two inputs of its multiplier $MULTI_p$ is connected to the input of the $p^{th}$ flip-flop delay unit $D_p$, the input of its accumulator $ACC_p$ is connected to the output of its multiplier $MULTI_p$, the output of the accumulator $ACC_p$ is taken as the output of the $p^{th}$ fractional operation unit $THD_p$; to the Nth fractional operation unit $THD_N$, one of the two inputs of its multiplier $MULTI_N$ is connected to the acquired data x(n) outputted by the signal acquisition and storage circuitry, another of the two inputs of its multiplier $MULTI_N$ is connected to the output of the N−$1^{th}$ D flip-flop delay unit $D_{N-1}$, the input of its accumulator $ACC_N$ is connected to the output of its multiplier $MULTI_N$ and
  a fractional operation results memory FO RAM, which is used for storing the operation results of the N fractional operation units $THD_1, THD_2, THD_3, \ldots, THD_N$;
  wherein the fractional calculus circuitry is configured to control the fractional operation, when the oscilloscope data done signal DSO_DONE is turned from 0 to 1 is detected, by performing the following steps:

(1): initializing initializing fractional operation number i to 1, the flag i_done of the $i^{th}$ fractional calculus operation to 0, fractional operation done signal FO_DONE to 0;

(2): resetting resetting the initial values of the N−1 D flip-flop delay units $D_1, D_2, D_3, \ldots, D_{N-1}$ to 0, setting the read address $ADDR_{adcram}$ of the acquisition memory ADC RAM to N*i−1, resetting the read address $ADDRc_{oram}$ of the fixed coefficient memory CO RAM to 0, resetting the initial values of the accumulators of the N fractional operation units $THD_1, THD_2, THD_3, \ldots, THD_N$ to 0, resetting the write address $ADDR_{foram}$ of the fractional operation results memory FO RAM to 0;

(3): reading data to multiply and accumulate driven by a system clock clk, the fractional calculus circuitry initiates an operation of reading the acquisition memory ADC RAM and an operation of reading the fixed coefficient memory CO RAM at each system clock, the total number of reading is k, k=N*i; to each reading, the read address $ADDR_{adcram}$ is subtracted by 1, and the read address $ADDR_{coram}$ is added by 1;

the data outputted by the read data port of the acquisition memory ADC RAM in chronological order are acquired data x(k−1), . . . , x(1), x(0), namely, the data sent to the port As of the multipliers of the N fractional operation units are acquired data x(k−1) at $o^{th}$ system clock, the data sent to the port As of the multipliers of the N fractional operation units are acquired data x(k−2) at 1 st system clock, the data sent to the port As of the multipliers of the N fractional operation units are acquired data x(k−2) at a system clock, and so on, the data sent to the port As of the multipliers of the N fractional operation units are acquired data x(0) at $(k-1)^{th}$ system clock;

the data outputted by the read data port of the fixed coefficient memory CO RAM in chronological order are the fixed data c(0), c(1), . . . , c(k−1), the fixed data c(0), c(1), . . . , c(k−1) are serially sent to the N−1 D flip-flop delay units $D_1, D_2, D_3, \ldots, D_{N-1}$ to namely, at $o^{th}$ system clock, the data sent to the port B of the multiplier of the $1^{st}$ fractional operation unit $THD_1$ is the fixed data c(0), the data sent to the port Bs of the multipliers of the rest of the fractional operation units are 0, at 1° system clock, the data sent to the port Bs of the multipliers of the 1', the $2^{TM}$ fractional operation units $THD_1, THD_2$ are respectively the fixed data c(1), c(0), the data sent to the port Bs of the multipliers of the rest of the fractional operation units are 0, at $2^{nd}$ system clock, the data sent to the port Bs of the multipliers of the $1^{st}$, the $2^{nd}$ and the $3^{rd}$ fractional operation units $THD_1, THD_2, THD_2$ are respectively the fixed data c(2), c(1), c(0), the data sent to the port Bs of the multipliers of the rest of the fractional operation units are 0, and so on, until at the (k−1)th system clock, the data sent to the port Bs of the multipliers of the N fractional operation units $THD_1, THD_2, THD_3, \ldots, THD_N$ are respectively c(k−1), . . . , c(2), c(1), c(0);

after each reading, all the N fractional operation units $THD_1, THD_2, THD_3, \ldots, THD_N$ perform a multiplying operation and an accumulating operation in turn, when the number of the accumulations reaches k, the $i^{th}$ fractional calculus operation is accomplished, the in fractional operation done signal i_done is turned from 0 to 1;

(4): storing the results of the i" fractional calculus operation when the $i^{th}$ fractional operation done signal i_done is turned from 0 to 1 is detected, the outputs of the N fractional operation units $THD_1, THD_2, THD_3, \ldots, THD_N$ are taken as the results y(k−1), y(k−2), y(k−3), . . . , y(k-N) of the $i^{th}$ fractional calculus operation and merged into a merged data, the merged data are stored into the fractional operation results memory FO RAM at address $ADDR_{foram}$ under the same system clock clk;

(5) judging whether a frame of acquired data, namely L acquired data are calculated judging whether the current fractional operation number i is less than L/N, if yes, the write address $ADDR_{foram}$ is added by 1, the current fractional operation number i is added by 1, the i fractional operation done signal i_done is set to 1, then returning to step (2); if not, the fractional operation done signal FO_DONE is set to 1, stopping the fractional calculus operation;

when the fractional operation done signal FO_DONE is turned from 0 to 1 is detected, the digital oscilloscope control controller performs the following steps:

(1): sending the acquired data x(m), n=1, 2, . . . ,L−1 stored in the acquisition memory ADC RAM and the fractional calculus result data y(n), n=1, 2, . . . ,L−1 stored the fractional operation results memory FO RAM to signal processing and display circuitry, in which the acquired data x(n) and the fractional calculus result data y(1) are respectively converted into a display data through a drawing thread, and the two display data are sent to LCD for displaying;

(2): resetting the oscilloscope data done signal DSO_DONE and the fractional operation done signal FO_DONE to 0 to enable the signal acquisition and storage circuitry and the fractional calculus circuitry.

2. A digital oscilloscope having fractional calculus operation and display function of claim 1, wherein:

after sending the acquired data x(n) and the fractional calculus result data y(n) to signal processing and display circuitry, the vertical sensitivity corresponding to the acquired data x(n) is multiplied with the number of the vertical divisions of the display area to obtain a display range R1, the vertical sensitivity corresponding to the fractional calculus result data y(n) is multiplied with the number of the vertical divisions of the display area to obtain another display range R2;

the acquired data x(n) is normalized as:

$$d_x(n) = \left(\frac{x(n)}{2^v - 1} - 0.5\right) \times R_1$$

the fractional calculus result data y(n) is normalized as:

$$d_y(n) = \left(\frac{y(n)}{(2^v - 1) \times R_2/R_1} - 0.5\right) \times R_2$$

where v is the digit number of the ADC;

the data $d_x(n)$ and $d_y(n)$ are sent to a drawing thread, through which the data $d_x(n)$ and $d_y(n)$ are respectively converted into a display data, and the two display data are sent to LCD for displaying.

* * * * *